(12) United States Patent
Peng et al.

(10) Patent No.: US 6,501,656 B1
(45) Date of Patent: Dec. 31, 2002

(54) CLIP FOR HEAT SINK

(75) Inventors: Xian Cai Peng, Zhenshen (CN); Ming Hung Yang, Taipei (TW); Cheng-Chi Lee, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/894,094

(22) Filed: Jun. 28, 2001

(51) Int. Cl.[7] .................................. H05K 7/20
(52) U.S. Cl. .................. 361/703; 248/510; 257/719; 361/695; 29/890.03
(58) Field of Search .............. 29/890.03, 832, 29/840; 361/687, 695, 697, 703, 704, 717–719; 257/718, 719, 722, 726, 727; 174/16.3; 165/121, 80.3, 185; 24/453, 457, 458, 625; 248/316.7, 505, 510; 267/150, 158, 160

(56) References Cited

U.S. PATENT DOCUMENTS

| | | | | |
|---|---|---|---|---|
| 4,054,901 A | * | 10/1977 | Edwards et al. ............ 257/718 |
| 4,557,024 A | * | 12/1985 | Roberts et al. ........... 24/20 TT |
| 5,401,905 A | * | 3/1995 | Lesser et al. ............. 174/99 R |
| 5,671,118 A | * | 9/1997 | Blomquist .................. 361/704 |
| 5,828,551 A | * | 10/1998 | Hoshino et al. | |
| 5,933,326 A | * | 8/1999 | Lee et al. .................... 361/704 |
| 5,953,212 A | * | 9/1999 | Lee ............................. 361/709 |
| 5,982,620 A | * | 11/1999 | Lin ............................. 361/704 |
| 6,229,705 B1 | * | 5/2001 | Lee ............................. 361/704 |

* cited by examiner

*Primary Examiner*—Gerald Tolin
(74) *Attorney, Agent, or Firm*—Wei Te Chung

(57) ABSTRACT

A clip (10) includes a first member (12) and a second member (14). The first member includes a spring portion (122), a first leg (126) extending from one end of the spring portion, and a handle (128) extending from an opposite end of the spring portion. The spring portion has flanges (130) extending from opposite sides thereof and folded back thereover for reinforcing the clip. The handle defines a cutout (134) including a receiving section (136) and a locking section (138). The second member includes a connect portion (144) forming a plurality of teeth (148) on opposite edges thereof, and a second leg (142). The connect portion is received in the receiving section and engages in the locking section. A slot (146) in the connect portion facilitates elastic deformation. The effective length of the second member is adjustable according to the particular teeth selected to engage in the locking section.

11 Claims, 4 Drawing Sheets

CLIP FOR HEAT SINK

BACKGROUND OF THE INVENTION

1. Field of the Invention

The present invention relates to clips securing heat sinks onto heat-generating electronic devices, and particularly to clips which readily and securely attach a heat sink to an electronic device.

2. Prior Art

Computer electronic devices such as central processing units (CPUs) frequently generate large amounts of heat, which can destabilize operation and cause damage. A heat sink placed in thermal contact with an electronic device mounted on a socket transfers heat from the electronic device through conduction. Oftentimes, the heat sink is secured to the electronic device with a clip.

FIG. 4 shows a conventional clip 1. The clip 1 comprises a central press portion 2, a pair of spring portions 3 respectively extending in opposite directions from the press portion 2, and a pair of legs 4 respectively depending from the spring portions 3. Each leg 4 defines an opening 5 for engaging with a catch formed on a socket, to thereby secure a heat sink to an electronic device.

This kind of clip 1 is integrally formed by stamping and bending. The lengths of the legs 4 of the clip 1 are not adjustable. Thus the fixing force of the clip 1 cannot be adjusted to fit heat sinks of varying size and weight. In other words, the clip 1 is not very versatile. Furthermore, during assembly, the clip 1 must be attached to a heat sink prior to installation of a fan. This can be unduly inconvenient, particularly for mass production on an assembly line. Moreover, the legs 4 of the clip 1 are prone to plastic deformation, particularly after prolonged use of the clip 1. The clip 1 is then not able to securely attach a heat sink to an electronic device.

SUMMARY OF THE INVENTION

Accordingly, an object of the present invention is to provide a clip which readily and securely attaches a heat sink to an electronic device.

Another object of the present invention is to provide a clip which has adjustable fixing force according to the particular heat sink being used.

To achieve the above-mentioned objects, a clip in accordance with the present invention comprises a first member and a second member attached to the first member. The first member comprises a spring portion, a first leg extending from one end of the spring portion and adapted to engage with a socket, and a handle extending from an opposite end of the spring portion. A pair of flanges extends from opposite side edges of the spring portion. Both flanges are folded back one over the other and over the spring portion, for reinforcing the clip. The handle defines a cutout comprising a receiving section and a locking section. The second member comprises a connect portion forming a plurality of teeth on opposite edges thereof, and a second leg. The connect portion is first received in the receiving section and then engages in the locking section. A slot is defined through the connect portion for facilitating elastic deformation of the connect portion. The effective length of the second member is adjustable according to the particular teeth selected to engage in the locking section.

Other objects, advantages and novel features of the present invention will be drawn from the following detailed embodiment of the present invention with attached drawings, in which:

DESCRIPTION OF THE PREFERRED EMBODIMENT

Figure 1:
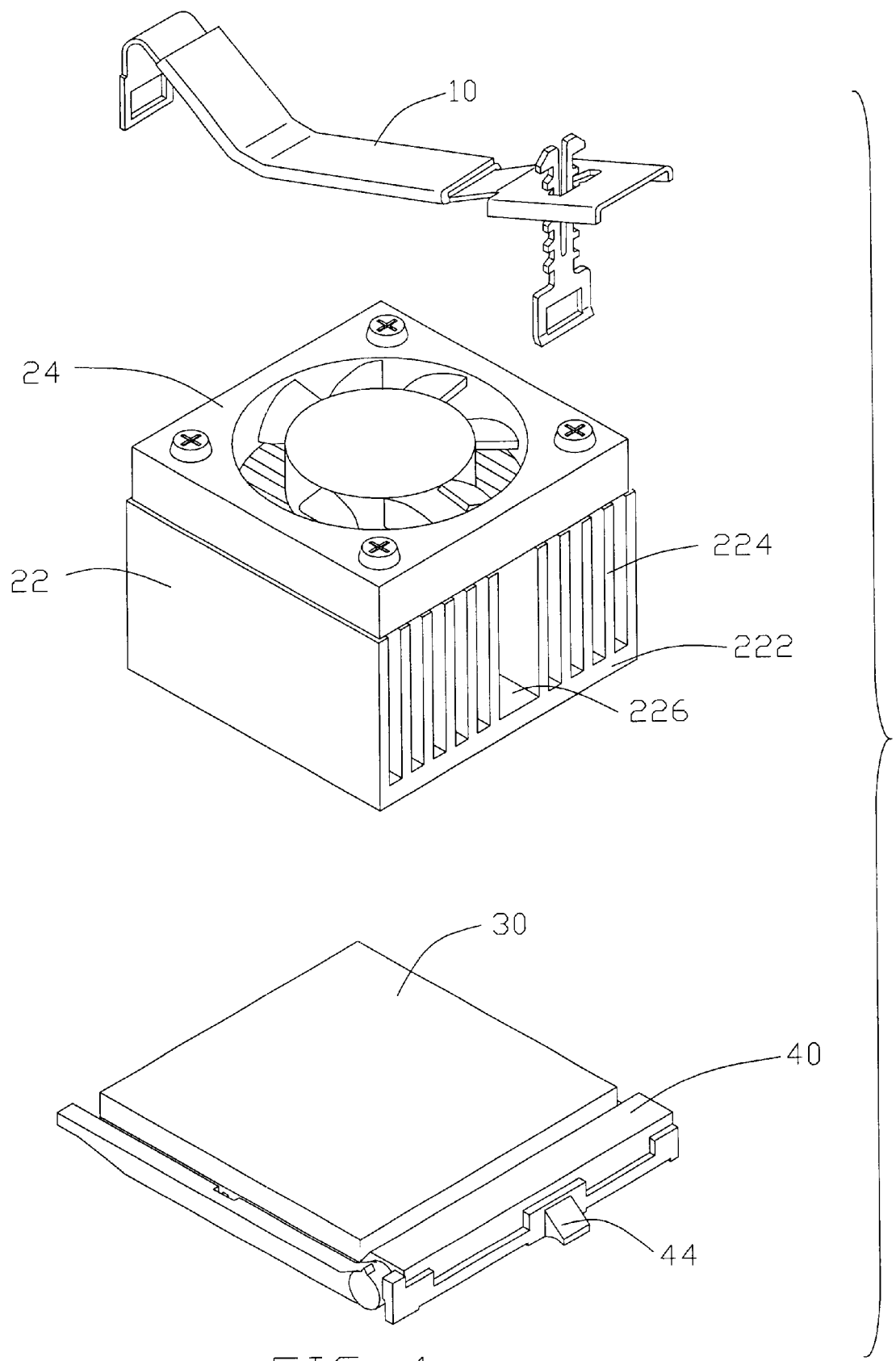
FIG. 1 is an exploded view showing a clip of the present invention for attaching a heat sink to a central processing unit mounted on a socket, the heat sink having a fan attached thereon.

Referring to the attached drawings, FIG. 1 is an exploded view showing a clip 10 of the present invention for attaching a heat sink 22 to a central processing unit (CPU) 30 mounted on a socket 40. The heat sink 22 has a fan 24 attached thereon.

The heat sink 22 comprises a base 222 having a bottom face (not labeled), and a top face (not labeled) opposite to the bottom face. A plurality of fins 224 extends upwardly from the top face of the base 222. A channel 226 is defined between two adjacent central fins 224. The fan 24 is attached on the fins 224 of the heat sink 22. A pair of catches 44 (one not visible) is formed on opposite sides of the socket 40 respectively.

Figure 2:
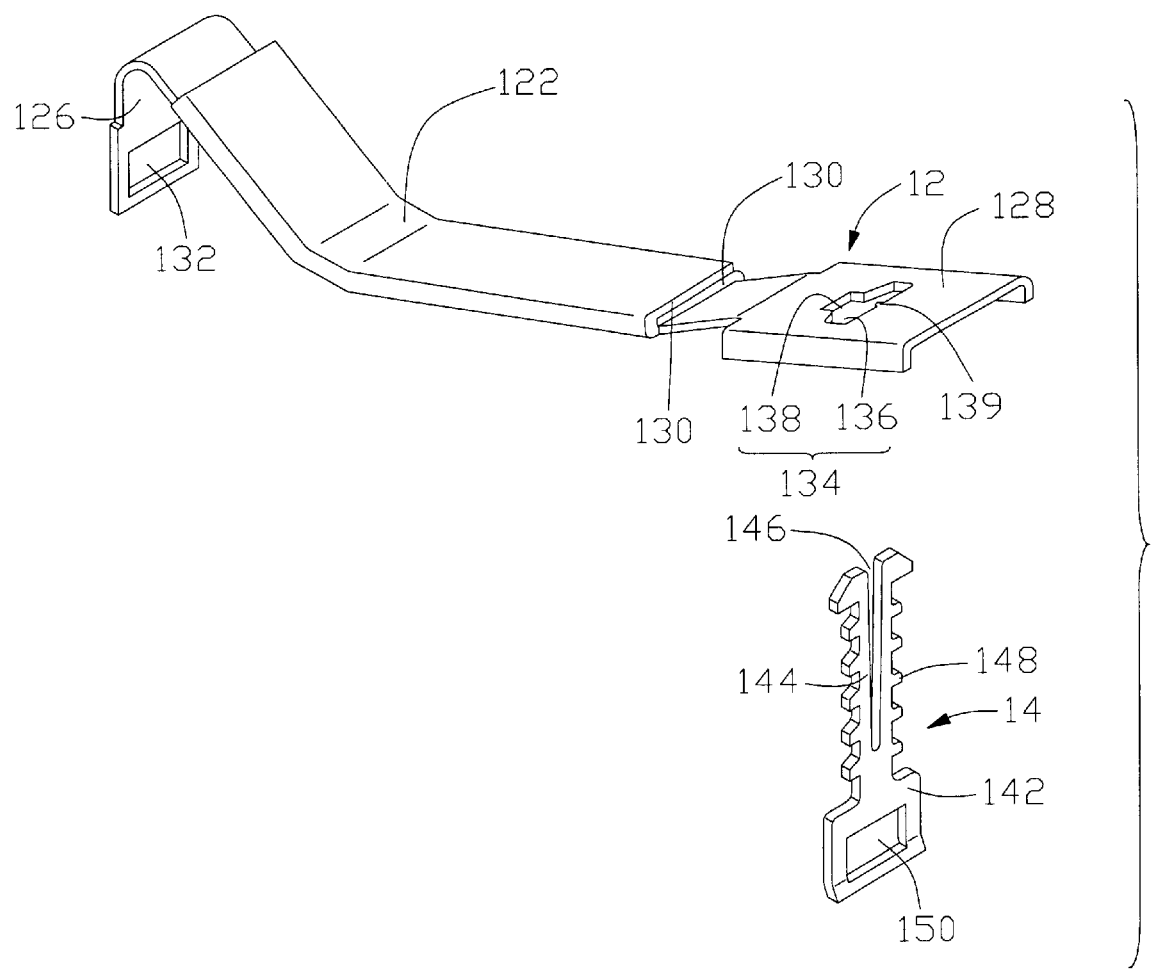
FIG. 2 is an exploded view of the clip of FIG. 1.

Referring also to FIG. 2, the clip 10 in accordance with the present invention comprises a first member 12 and an second member 14 attached to the first member 12. The first member 12 comprises a central spring portion 122, a first leg 126 extending downwardly from one end of the spring portion 122, and a handle 128 extending from an opposite end of the spring portion 122. A pair of flanges 130 extends from opposite side edges of the spring portion 122. Both flanges 130 are folded back one over the other and over a top surface of the spring portion 122, for reinforcing the clip 10. A first aperture 132 is defined in the first leg 126. A cutout 134 is defined in the handle 128. The cutout 134 comprises a receiving section 136 and a locking section 138. The locking section 138 is smaller than the receiving section 136, is disposed inwardly from the receiving section 136, and is in communication with the receiving section 136. A protrusion 139 is formed on one edge of the handle 128 at the cutout 134. The protrusion 139 is opposite to the locking section 138, and extends into the cutout 134 toward the locking section 138.

The second member 14 comprises a second leg 142, and a connect portion 144 extending upwardly from the second leg 142. A second aperture 150 is defined in the second leg 142. The connect portion 144 forms a plurality of symmetrically opposite teeth 148 on opposite edges thereof, for entering into the receiving section 136 and engaging in the locking section 138 of the cutout 134 of the first member 12. A distance between outmost ends of topmost teeth 148 is greater than a corresponding width of the receiving section 136, for preventing the second member 14 from slipping out of the cutout 134. A slender V-shaped slot 146 is defined through a middle of the connect portion 144 from a top edge thereof, for facilitating elastic deformation of the connect portion 144.

Figure 3:
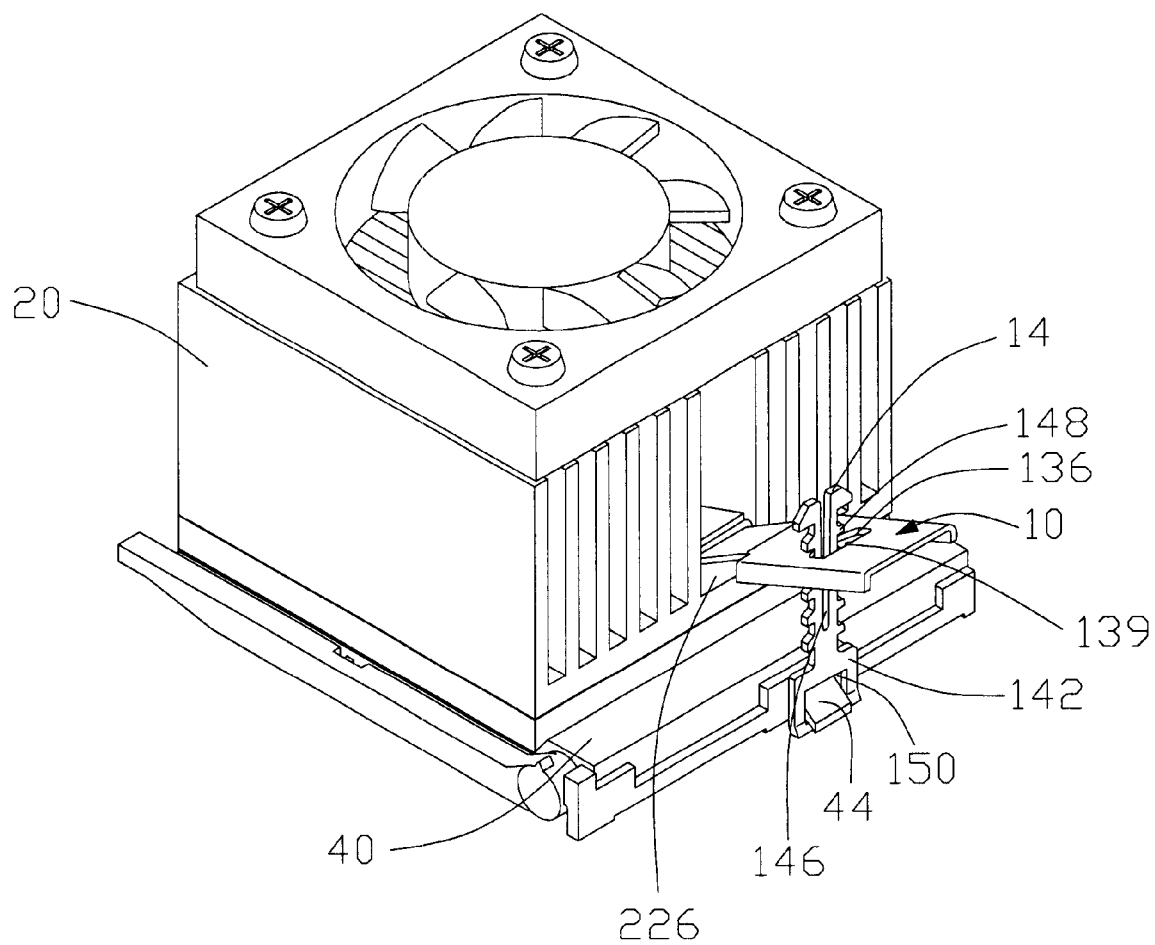
FIG. 3 is an assembled view of FIG. 1.
Figure 4:
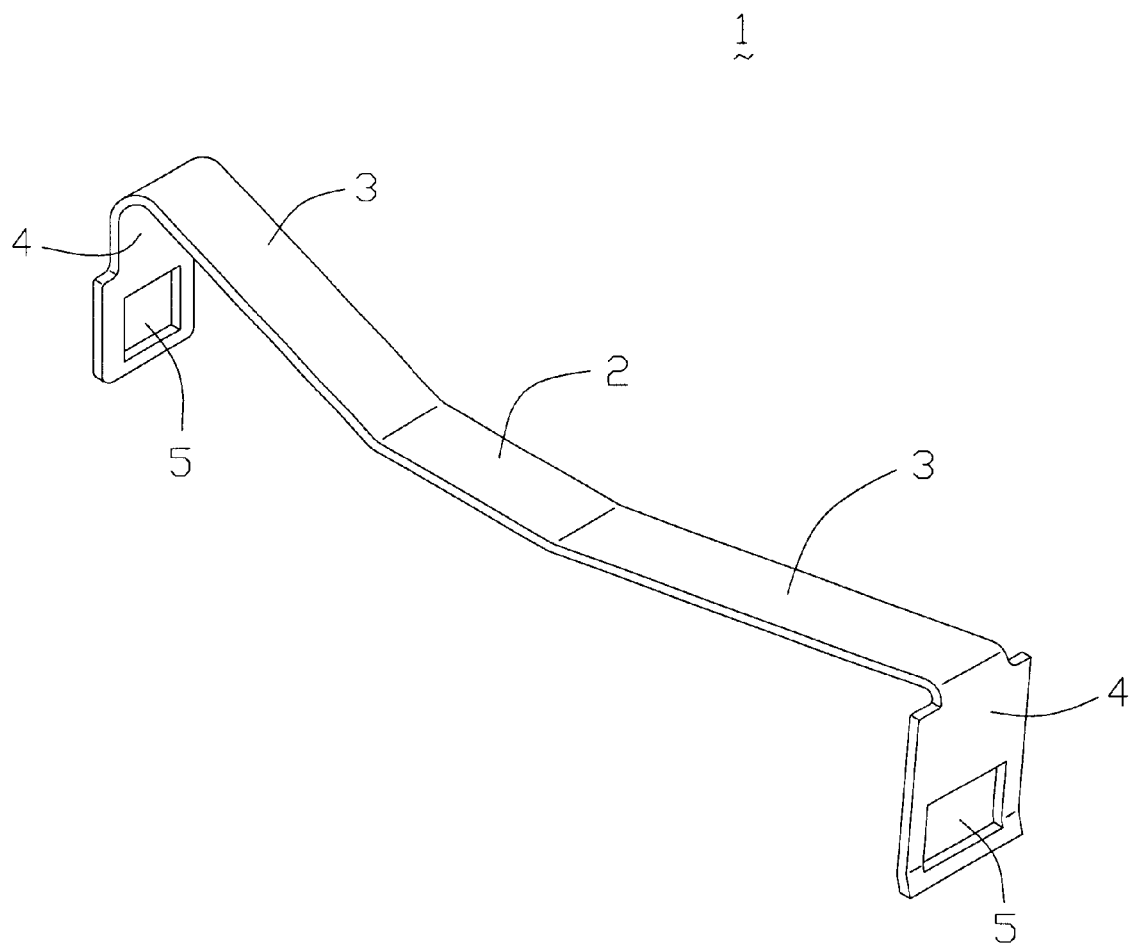
FIG. 4 is a perspective view of a conventional clip.

Referring also to FIG. 3, in assembly, the first member 12 of the clip 10 is passed through the channel 226 of the heat sink 22. The connect portion 144 of the second member 14 is inserted into the receiving section 136 of the first member 12 from under the handle 128. The connect portion 144 elastically deforms to allow the topmost teeth 148 to engage with the handle 128 in the receiving section 136 of the first member 12. The protrusion 139 is received in the slot 146, thereby pre-positioning the connect portion 144 in the cutout 134. The combined heat sink 22, fan 24 and clip 10 is then placed onto the CPU 30. The catches 44 of the socket 40 are loosely received in the first and second apertures 132, 150 of the first and second legs 126, 142 respectively. A pair of directly opposite teeth 148 is selected according to the particular dimensions of the heat sink 22. The handle 128 is depressed and the connect portion 144 is simultaneously pushed toward the locking section 138 of the first member 12, such that the pair of selected teeth 148 engage at the locking section 138. The catches 44 of the socket 40 are thereby firmly engaged by the first and second legs 126, 142 at the first and second apertures 132, 150. The heat sink 22 with the fan 24 attached thereon is thus firmly fixed on the CPU 30.

In the present invention, an effective operating length of the second member 14 between the second leg 142 and the engagement of the connect portion 144 in the locking section 138 is adjustable. Adjustment varies according to which pair of directly opposite teeth 148 engages in the locking section 138. Thus the fixing force of the clip 10 is adjustable according to the particular heat sink 22 being used. Accordingly, the clip 10 can securely attach a variety of heat sinks 22 onto the CPU 30. Furthermore, the flanges 130 of the first member 12 reinforce the clip 10. Thus the clip 10 is able to sustain a large fixing force.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted to secure a heat sink to an electronic device mounted on a socket, comprising:

a first member comprising a spring portion, a first leg depending from one end of the spring portion and adapted to engage with one side of the socket, and a handle extending from an opposite end of the spring portion, the handle defining a cutout comprising a receiving section and a locking section which is smaller than the receiving section; and a second member connected with the handle, the second member comprising a connect portion receivable in the receiving section and engaged in the locking section, and a second leg adapted to engage with an opposite side of the socket;

wherein an effective length of the second member between the second leg and the engagement of the connect portion in the locking section is adjustable by way of adjusting means formed on the connect portion of the second member, and wherein the adjusting means comprises a plurality of symmetrically opposite teeth formed on opposite edges of the connect portion.

2. The clip as claimed in claim 1, wherein a slot is defined in the connect portion of the second member for facilitating elastic deformation of the connect portion.

3. The clip as claimed in claim 1, wherein at least one flange extends from at least one of opposite side edges of the spring portion of the first member, and each flange is folded back over a top surface of the spring portion for reinforcing the clip.

4. The clip as claimed in claim 1, wherein a distance between outmost ends of topmost teeth is greater than a corresponding width of the receiving section of the first member, for preventing the second member from slipping out of the cutout of the first member.

5. The clip as claimed in claim 3, wherein a protrusion is formed on one edge of the handle of the first member at the cutout and opposite to the locking section, for being received in the slot of the second member to pre-position the connect portion of the second member in the cutout of the first member.

6. An electronic device assembly comprising:

a socket having first and second catches on opposite sides thereof;

an electronic device mounted on the socket;

a heat sink placed on the electronic device for dissipating heat from the electronic device; and a clip interlocked with said first and second catches for pressing said heat sink against said electronic device, including a first member having a spring portion pushing against the heat sink, and a first leg engaged with said first catch of the socket; and a second member connected with the first member, the second member having a second leg engaged with said second catch of the socket and having a plurality of teeth;

wherein a length between the second leg and a connect point between the second member and the first member is adjustable according to the tooth selected to engage with the first member.

7. A clip for fastening a heat sink to an electronic device, comprising:

a first member comprising a spring portion adapted for pressing against the heat sink, a first leg depending from an end of the spring portion, said first leg forming an engaging structure about a lower end thereof; and a second member forming an engaging structure about a lower end thereof, and a connect portion above the engaging structure of the second member and connected to an opposite end of the spring portion of the first member, said connect portion being configured with a plurality of pairs of teeth formed at its opposite side edges that an effective length of the second member between the lower end and its engagement with the opposite end of the spring portion of the first member is adjustable along a length of the connect portion according to the tooth selected to engage with the first member, a slot being vertically defined in a middle portion of the connect portion and extending downwardly from a top edge of the connect portion.

8. The clip as claimed in claim 7, wherein the opposite end of the spring portion of the first member defines a cutout therein, the cutout comprising a receiving section and a locking section communicating with each other, the receiving section being larger than the locking section, the connect portion of the second member being receivable in the receiving section and engaged in the locking section to engage with the opposite end of the spring portion of the first member.

9. A method for assembling a heat sink assembly, comprising:

preparing a heat sink with a base and a plurality of fins extending upwardly from the base;

mounting an electric fan onto the fins;

extending a spring portion of a first member of a clip through the fins, said first member having a first leg depending from an end of the spring portion, said first leg having an engaging structure near a lower end thereof; and connecting a second member of the clip to an opposite end of the spring portion, the second member being located outside an edge of the base of the heat sink, the second member having an engaging structure about a lower end thereof, a length between the engaging structure of the second member and the connection between the second member and the opposite end of the spring portion of the first member being adjustable by selecting connecting points of the second member with the opposite end of the spring portion of the first member without changing the second member.

10. The electronic device assembly as claimed in claim 6, wherein the first member defines a cutout comprising a receiving section and a locking section communicating with each other, and wherein the teeth are receivable in the receiving section and engagable in the locking section.

11. A method for assembling a heat sink assembly, comprising:

preparing a heat sink with a base and a plurality of fins extending upwardly from the base;

mounting an electric fan onto the fins;

extending a spring portion of a first member of a clip through the fins, said first member having a first leg depending from an end of the spring portion, said first leg having an engaging structure near a lower end thereof, said spring portion defining a cutout in an opposite end thereof; and connecting a second member of the clip to an opposite end of the spring portion, the second member being located outside an edge of the base of the heat sink, the second member having an engaging structure about a lower end thereof and a plurality of symmetrically opposite teeth formed on opposite edges thereof, a length between the engaging structure of the second member and the connection between the second member and the opposite end of the spring portion of the first member being adjustable according to a pair of particular teeth selected to engage in the cutout.

* * * * *